United States Patent [19]

Berthold

[11] Patent Number: 5,700,404
[45] Date of Patent: Dec. 23, 1997

[54] PROCESS AND DEVICE FOR CASTING A LARGE-AREA CRYSTALLINE SALT BODY

[75] Inventor: Thomas Berthold, München, Germany

[73] Assignee: Siemens Aktiengesellschaft, Munich, Germany

[21] Appl. No.: 553,404

[22] PCT Filed: May 16, 1994

[86] PCT No.: PCT/DE94/00567

§ 371 Date: Nov. 22, 1995

§ 102(e) Date: Nov. 22, 1995

[87] PCT Pub. No.: WO94/28205

PCT Pub. Date: Dec. 8, 1994

[30] Foreign Application Priority Data

May 25, 1993 [DE] Germany ............ 43 17 379.9
Sep. 22, 1993 [DE] Germany ............ 43 32 535.1

[51] Int. Cl.$^6$ .............. B29D 11/00; G02B 1/00
[52] U.S. Cl. .............. 264/1.21; 264/31.23; 264/1.22; 264/2.1; 264/310; 264/332; 117/81; 117/83
[58] Field of Search .............. 264/1.21, 1.23, 264/1.22, 2.1, 21, 310, 311, 332; 425/223, 446, 447, 453; 249/105, 100, DIG. 5; 117/81, 83

[56] References Cited

U.S. PATENT DOCUMENTS

| | | | |
|---|---|---|---|
| 1,155,839 | 10/1915 | Schneider | 425/447 |
| 1,399,798 | 12/1921 | Rowe | 249/DIG. 5 |
| 3,367,394 | 2/1968 | Roder et al. | 117/83 |
| 3,861,849 | 1/1975 | Richmond et al. | 425/447 |
| 4,038,201 | 7/1977 | Hargreaves . | |
| 4,382,838 | 5/1983 | Authier . | |
| 5,178,719 | 1/1993 | Pandelisev . | |

FOREIGN PATENT DOCUMENTS

| | | |
|---|---|---|
| 0 338 411 | 10/1989 | European Pat. Off. . |
| 25 08 803 | 9/1976 | Germany . |
| 40 02 320 | 8/1991 | Germany . |

Primary Examiner—Donald E. Czaja
Assistant Examiner—Michael Colaianni
Attorney, Agent, or Firm—Hill, Steadman & Simpson

[57] ABSTRACT

A process and device for producing an optically pure polycrystalline salt body by melting a starting material for the salt and then introducing the melted material into a casting mould having a base which is kept at a temperature of 1° C. to 50° C. below the melting point of the material to form a solid crust on the base and then solidifying the entire melt to form the polycrystalline salt body.

18 Claims, 6 Drawing Sheets

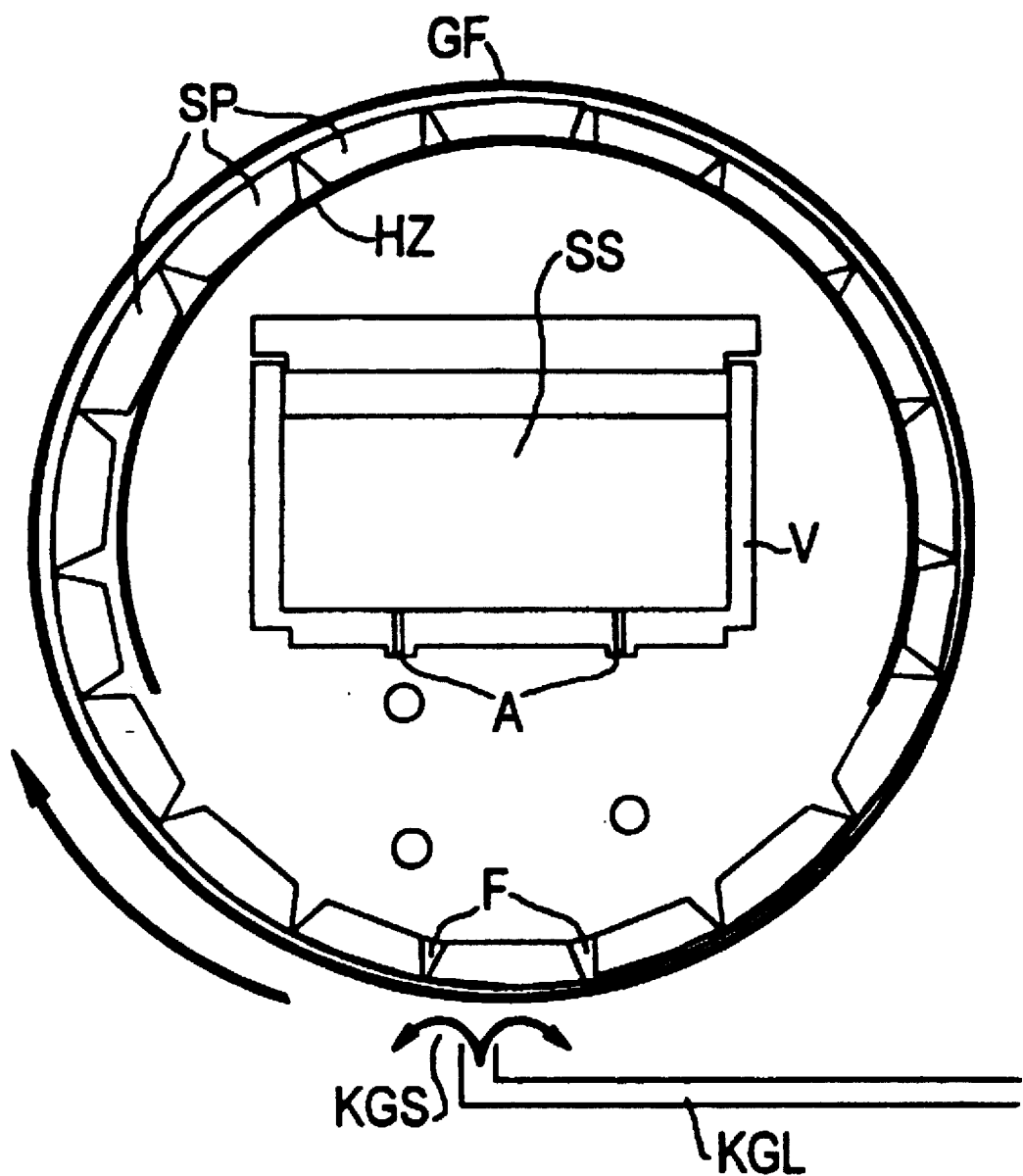

PROCESS AND DEVICE FOR CASTING A LARGE-AREA CRYSTALLINE SALT BODY

BACKGROUND OF THE INVENTION

Large scintillator plates composed of sodium iodide doped with thallium are required in nuclear medicine for the Anger camera for detecting gamma rays. These detectors are used to observe the distribution in the human body of radioactive labelled or radioactive marker substances which have previously been introduced into the body. The change or the accumulation of the radioactive marker substances may provide information about metabolic processes and about, in particular, active local disease foci, for example about cancerous ulcers. In applications of the Anger camera to date, rectangular or circular plates with dimensions of up to 40 cm by 60 cm or up to 60 cm diameter, with a thickness of 10 to 12 mm, are required as scintillator plates.

The disadvantage of detectors of these dimensions is that it is always possible to observe only a particular section of the patient's body in one investigation. However, for certain medical investigations it is an advantage to be able to image the distribution of radioactive-labelled substances or drugs in the patient's body by a whole-body film. It would thus be possible to investigate functions which embrace the entire body, for example arterial, nervous and lymphatic systems, without the necessity for repeated introduction of the substances labelled with short-lived radionuclides, which result in the patient being heavily exposed to radiation. Another problem is that the imaging is greatly affected by reflections at the edge of the scintillator plate. In this respect a very large scintillator plate with which the reflecting edge is as far as possible from the region of the plate on which gamma rays impinge is more favourable.

German Patent DE 40 02 320 C2 proposes the production of salt bodies which are suitable as luminescent material from doped alkali metal halides by allowing a doped melt of the salt to solidify. To do this, the melt of the salt is, immediately after the addition of the volatile thallium halide which is added as doping substance, rapidly cooled to the extent that at least the surface of the melt is solidified. The salt body obtained after complete cooling can be detached from the melting crucible or the casting mould only by destruction thereof because alkali metal halides on solidification adhere extremely well to many materials. However, since the inert materials suitable for containing an alkali metal halide melt, such as, for example, quartz glass, graphite or noble metals, are relatively costly materials, loss of the casting mould after production of the salt bodies makes the process considerably more costly. In addition, reworking of all the surfaces of the resulting salt body is necessary.

For conventional scintillator plates, initially clear, bubble-free blocks of NaI:Tl are produced. Single crystals are obtained by the Bridgeman, Stockbarger or Czochralski process, whereas polycrystalline blocks can be produced by extrusion. Because all these blocks can be produced with only limited dimensions, to produce large-area plates they must be thermoformed to the required diameter by compression at temperatures above 300° C. in an additional step. This represents an industrially elaborate process and is, moreover, unsuitable for producing scintillator plates with dimensions of 60 cm by 200 cm, which would be required for whole-body investigations.

SUMMARY OF THE INVENTION

It is therefore an object of the present invention to provide a process for the production of a polycrystalline salt body which can be carried out more simply and at lower cost than known processes and nevertheless leads to optically clear crystal bodies without opacities, cracks and the like.

This object is achieved according to the invention by a process having the steps of producing a salt melt by melting a starting material with a composition intended for the salt body in a melting crucible which is inert to the salt melt; introducing the salt melt into a casting mould having a base kept at a temperature which is 1° C. to 50° below the solidification point of the salt melt to form a solid salt crust on the base of the casting mould; maintaining the casting mould at a temperature below the solidification point until the supernatant salt melt has solidified completely into the polycrystalline salt body and then cooling the salt body.

The essential feature of the process according to the invention is the preset temperature difference between the melt in the melting crucible or the melting point of the salt and the base of the casting mould, which must be sufficiently large to achieve the desired "quenching" of the melt in the casting mould. It has been found, surprisingly, that a temperature difference of only 5°–50° C. is sufficient for this purpose. In a particular embodiment of the invention, a temperature difference of 1° C. is in fact sufficient. This leads to direct crust formation in the casting mould. The crust protects the casting mould from attack by the chemically reactive melt of the salt because the latter is virtually unable to make contact with the casting mould. As a consequence, the choice of material for producing the casting mould is also no longer confined to those costly and inert materials necessary in previous experiments and processes involving melts of salts in order to prevent contamination of the salt body by material of the crucible or casting mould.

Furthermore, the crust which is directly formed prevents the melt from seeping into any gaps present in the casting mould. This makes it possible to construct the casting mould of a plurality of parts and to design the construction of the casting mould so that it can be taken apart again. This makes it possible for the salt body to be released in a simple way after solidification by taking the multipart casting mould apart. The removal of the salt body without difficulty from the mould without destroying the casting mould is particularly advantageous if the process is used to produce larger salt bodies, which my have a weight of up to several 100 kilograms.

A process in which a silicon melt is cast in a mould which consists of graphite, and within which a temperature gradient of at least 200° C. is set up, is disclosed, for example, in DE 25 08 803 A1. Allowing solidification to take place in the mould, which cannot be wetted by silicon, results in silicon plates suitable for solar cells. This process is not comparable with the process according to the present invention because of the non-wettability of the mould, the better removability from the mould and manipulability of the silicon wafers compared with a salt body which consists, for example, of a luminescent material and for which a high optical quality is required. The silicon casting process is carried out in vacuum.

The process according to the present invention can be used to produce salt bodies of virtually any desired size because the problem of the mechanical distortions arising on cooling because of differences in the thermal expansion of casting mould and salt body does not apply, in particular because the salt body scarcely adheres, if at all, to the casting mould. In known processes these distortions have led to an increased risk of fracture or to the occurrence of cracks in salt body and/or casting mould.

Since the casting mould neither undergoes attack by the melt of the salt nor needs to be destroyed when the salt body is removed from the mould, it can be used again as often as required, which means a further cost advantage of the process.

It is also possible to use in place of a flat casting mould one with a contoured base. This makes it possible to produce salt bodies with a desired surface structure. A conceivable example is a casting mould curved in the base region, which makes possible or facilitates the production of a lens from the salt body. The production of Fresnel lenses is possible by providing V-shaped depressions in the casting mould. However, it is also possible with a particular shaping in the edge region for the salt body to be preshaped ready for later use. For example, it is possible to produce steps, channels or grooves which make it possible to fix the salt body in a device.

During solidification, the polycrystalline salt body preferentially grows from the bottom to the top. This directed solidification leads to crystals of high quality and optical purity with large grain diameters which reach, even in non-optimized processes, more than 10 cm.

The process can be used to produce salt bodies with any desired composition within the thermodynamic miscibility limits, but preferably composed of doped alkali metal halides which are required for the Anger camera for example bodies in the form of large luminescent material plates with a diameter of about 60 cm and a thickness of 10 to 12 mm. The preferred material in this case is sodium iodide doped with thallium. However, other alkali metal halides, for example caesium iodide, as well as other doping substances, for example bismuth compounds or those of the rare earths, can also be used in the process according to the invention.

In one embodiment of the invention, the melting of the starting material and the introduction into the casting mould is carried out continuously. Salt which has already melted is transferred directly from the melting crucible into the casting mould, which can take place in a simple manner through outlet openings in the base of the melting crucible which is arranged above the casting mould. It is thus possible in a simple manner for the melting crucible and casting mould to he combined in a single device which, after introduction of the starting material into the melting crucible, requires no further external intervention. This has the further advantage that the salt melt is not heated to a temperature which is too high and at which evaporation of the volatile doping substances which are present where appropriate in the salt may take place.

The device can be set up for running a temperature programme for melting and cooling in an oven, in which case the only additional need is for cooling of the base of the casting mould. For this purpose preferably a cooling gas line is introduced from outside into the oven and a stream of cooling gas is blown onto the base of the casting mould. The temperature of melting crucible and casting mould is moreover monitored from outside and controlled via the oven temperature or the stream of cooling gas. During the process of melting and solidifying the salt used as starting material, the temperature set for the melting crucible is above the melting point of the salt, and the temperature set for the base of the casting mould is 1° to 50° C. below the melting point.

Since some of the alkali metal halides are very hygroscopic, the process is preferably carried out under a dry inert gas atmosphere. It is moreover possible for the device consisting at least of melting crucible and casting mould, to be sealed gas-tight. It is also possible to set up a gentle stream of inert gas through the device by means of a flushing gas line. If combustible materials, for example consisting of graphite, are used in the device, an oxygen-free atmosphere is preferably used to avoid oxidation of parts of the device.

In a further embodiment of the invention, before introduction of the salt melt, at least two crystalline salt plates which are in block or plate form and have a composition corresponding to the salt bodies are arranged side by side on the base of the casting mould in such a way that gaps of small widths remain between them. The salt melt is subsequently poured over the salt plates until at least the gaps are filled with the salt melt.

In the novel process, for example, salt plates consisting of NaI:Tl which have been produced by one of the above-mentioned conventional processes, are combined to form large-area polycrystalline salt bodies by a melt of the same or similar composition being poured into the gaps between the solid parts and solidifying there. In this case it is also possible to set up a difference between the temperature of the casting mould and the melting point which is lower than in the simplest embodiment of the invention and is 1°–50° C.

The salt plates used as starting material can be chosen to be as small as required and can therefore be produced simply and at low cost. The crystal quality of the salt plates also determines the crystal quality of the produced large-area salt bodies in which either the original gaps between the salt plates are no longer visually detectable in the finished sale plate or are specifically utilized for optical structuring. The salt bodies thus obtained are mechanically continuous, clear and bubble-free and their quality is suitable for producing scintillator plates for the Anger camera. An additional advantage is that the salt bodies can be produced with an area as large as required and in the shape required or with the cross-section required. Plates with a structured distribution of their optical properties (refractive index, transparency) can be produced by suitable doping substances in the melt.

The device likewise according to the invention for carrying out the process is explained in detail hereinafter by means of exemplary embodiments and the eleven figures pertaining thereto.

BRIEF DESCRIPTION OF THE DRAWINGS

FIG. 9 showing the mould with all of the melt added and FIG. 10 showing the mould with all of the melt solidified;

FIG. 11 is a diagrammatic cross-sectional view of another embodiment with a cylindrical casting mould.

DESCRIPTION OF THE PREFERRED EMBODIMENTS

Figure 1:
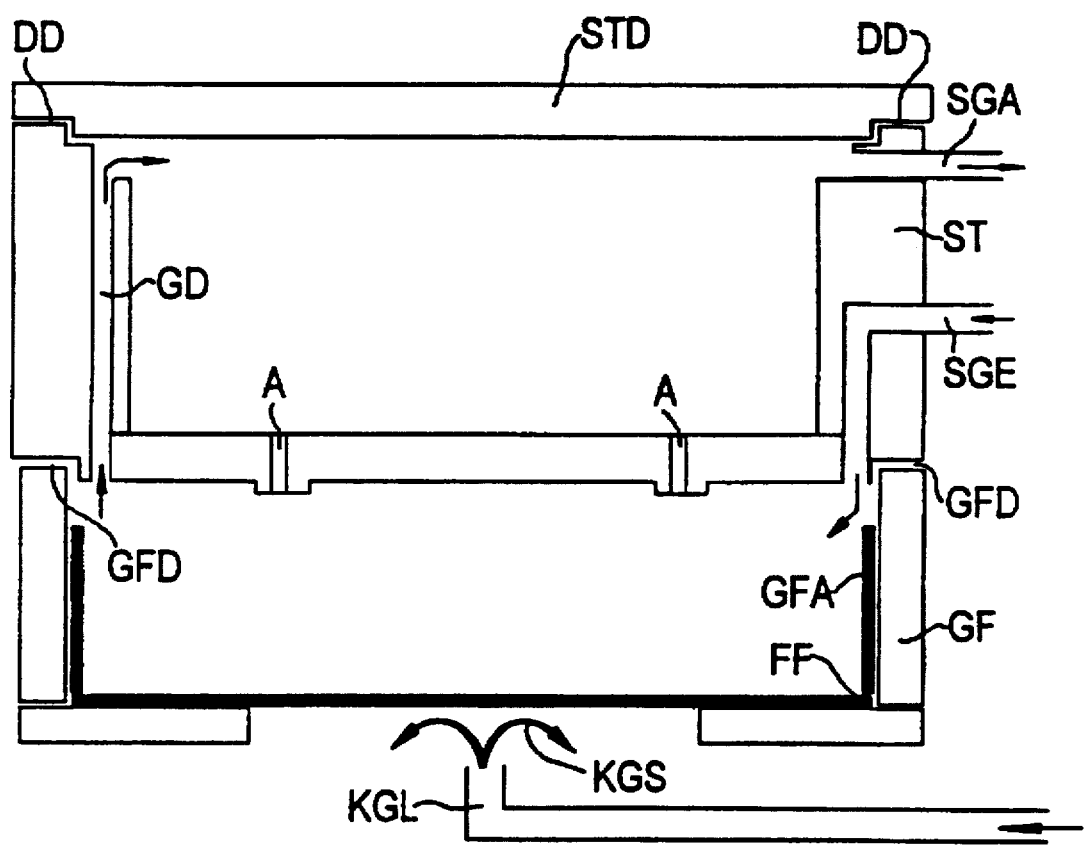
FIGS. 1–4 are diagrammatical cross-sectional views of a device according to the invention during various stages of a first exemplary embodiment, with FIG. 1 showing the device with a melt, FIG. 2 showing the device as the melt begins to enter the casting mould and forms a crust, FIG. 3 showing the device with the melt being separated from the walls of the mould by a crust, and FIG. 4 showing the melt completely solidified.

The principles of the present invention are particularly useful when incorporated in a device of FIG. 1. The device essentially consists of three parts, namely the casting mould GF, the melting crucible ST and the melting crucible lid STD. The device can have a circular, a rectangular or any other required base, which is chosen depending on the required shape of the salt body to be produced. The three components of the device are preferably designed so that they can be stacked securely one on top of the other. The parts can for this purpose each have on the contact surfaces a contour which can be inserted to fit accurately into the contour of the part stacked above it. It is additionally possible to provide sealing means between each of the parts stacked one above the other in order to seal the interior free volume of the device gas-tight towards the outside.

The casting mould seal GFD can additionally be designed to be thermally insulating in order to maintain, while the process is running, the temperature difference between the melting crucible and the cooler casting mould without a thermal bridge.

The melting crucible ST is made of a material which is inert to the melt of the salt and consists, for example, of graphite or a noble metal. Outlet openings A are provided in the base of the melting crucible ST and permit the melt which is formed in the melting crucible to run out into the casting mould. The casting mould GF itself can consist of any desired material which, however, is preferably a good conductor of heat, for example of graphite or stainless steel. The interior of the casting mould GF is provided with a lining GFA which can consist, for example of a plurality of glassy carbon plates lying side by side. The gaps FF remaining between the individual plates of the lining are no problem if they are no wider than about 0.2 mm. Wider gaps may, where appropriate, be filled in with a graphite-containing sealing paste. It is also possible, for example, to produce the lining GFA of noble metal or another suitable material.

Other important features of the device are the gas duct GD which connects the free volume of the melting crucible ST to that of the casting mould GF, and the duct SGA which represents the connection, where appropriate via filters, gas washers or pumps, to the outer atmosphere. The duct SGA prevents an excess pressure build up to cause a top-blowing of the gas-tight device owing to heating of the contained gas. It is possible by pumping to set up a slight negative pressure within the device in order to prevent emergence of toxic material if there are slight leaks. The vapours of the salt and the doping substances can be removed from the off-gas by gas washers and filters. The gas duct GD serves to equalize the pressure within the device when the melt flows out of the melting crucible ST through the outlet openings A. It is also optionally possible for further gas ducts to be provided, for example a flushing gas inlet SGE, in order to flush the device, which is otherwise sealed towards the outside, with an inert flushing gas, for example with dry nitrogen.

The base of the casting mould GF is designed to be coolable by suitable measures. This is depicted in the figure, for example, by a reduced thickness of the base of the casting mould at the point to be cooled. A cooling gas stream KGS supplied through internal or external cooling gas lines KGL is blown against the base of the casting mould GF at this point.

Figure 2:
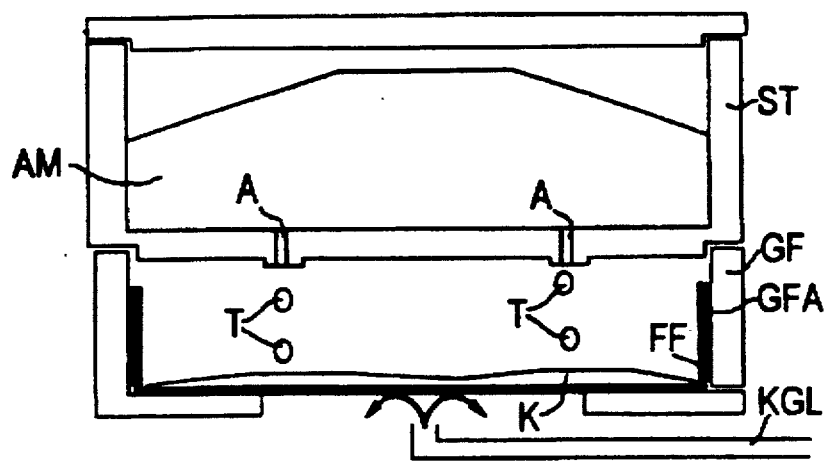

The melting crucible ST is now charged with starting material AM (see FIG. 2). This consists of the salt of the required composition in any desired form (powder, granules, pieces). The salt can already be doped with a doping substance suitable for uses in luminescent materials, or is introduced together with the doping substance as a mixture in the melting crucible. Sodium iodide doped with thallium iodide is used as the starting material AM for one application. Because of the volatility of the thallium halide, it is particularly important in this case that the lid STD on the melting crucible ST and the casting mould GF and crucible ST fit as tightly as possible together in order to prevent emergence of the toxic thallium halide during the heating. With suitably chosen sealing means DD and GFD it is moreover possible to maintain, via flushing gas lines, a pressure from 0.8 to two times the normal outside pressure within the device throughout the process.

To carry out the temperature programme for melting the starting material AM and during the cooling too, the entire device is placed in an oven. The oven is initially heated to a temperature above the melting point of the salt. When a preset temperature which is about 50° below the melting point of the salt is reached, the cooling of the casting mould GF or its base is started and, for this purpose, a cooling gas stream is blown against the base. The temperature of the casting mould GF and of the melting crucible ST is monitored during this by means of temperature sensors, for example with nickel/chromium/nickel thermal elements. The temperature of the base during this should be kept at a value which is 5°–50° C. below the melting point of the starting material. Once the melting crucible has exceeded the melting point of the salt, the starting material begins to melt and drip out or run out through the outlet openings A which are located in the base of the melting crucible ST into the casting mould GF underneath it.

FIG. 2 shows the device immediately after the onset of melting of the starting material AM. The drops T impinging on the cooler base of the casting mould GF have already led, owing to immediate solidification, to the formation there of a crust K covering the base of the casting mould GF or of the casting mould lining GFA. This leads to immediate sealing of gaps FF present where appropriate in the casting mould lining or the casting mould. The gas ducts GD, which are not depicted in this case for clarity, ensure equalization of pressure between casting mould GF and melting crucible ST in order to allow the melt of the salt to flow out unhindered through the outlet openings A into the casting mould GF.

After formation of the crust K and after further flowing or dripping of melt onto the crust, a large part of the melt remains above the crust. The temperature, and thus the rate of melting, is in this case controlled so that the crust is subsequently covered as completely as possible by melt in order to suppress an increased rate of growth, owing to sublimation towards the solid crust, of the salt body on the (cooler) edges of the casting mould.

Figure 3:
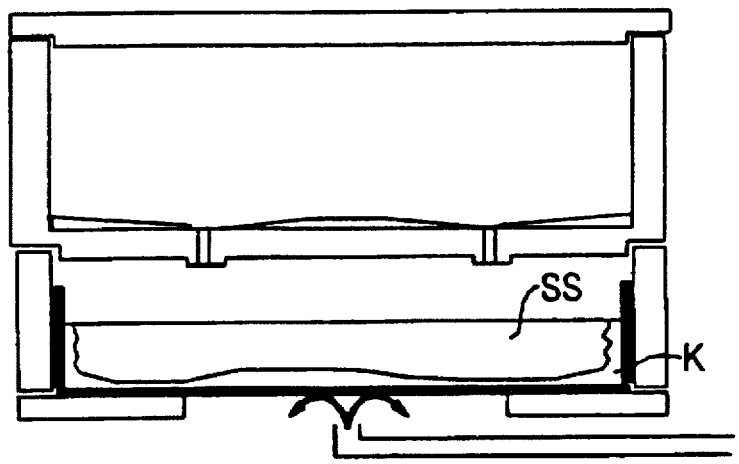

FIG. 3 shows the device after all the starting material has melted and run out into the casting mould GF. It is clearly evident that there is salt melt SS which has not yet solidified on top of the already solidified crust K of the salt body which is being formed. Even without changing the temperature conditions which have been set in the device, the salt body now grows, starting from the crust K, upwards essentially by solidification.

Figure 4:
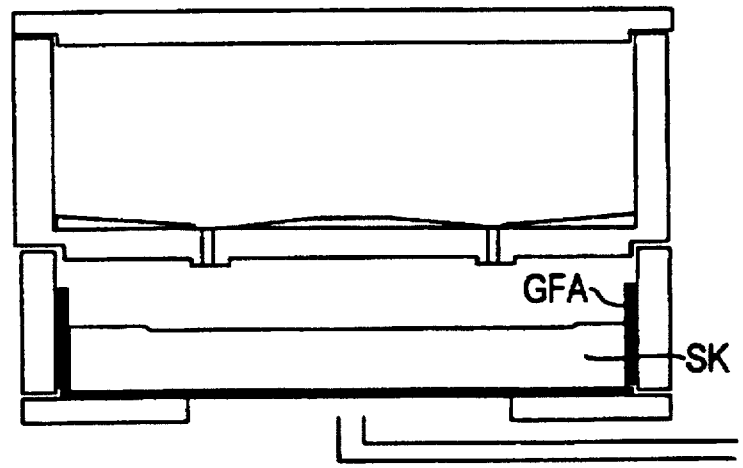

FIG. 4 shows the device at a stage in which the melt has already completely solidified in the casting mould GF and formed a continuous salt body SK. Because of the volume contraction in the transition from the liquid to the solid state, a trough or a layer permeated by cavities results on the upper side of the salt plate.

A particularly high quality salt body is obtained if the solidification phase takes a longer time. However, after solidification is complete, rapid cooling is possible, for example at 100° per hour, without the risk of distortions and, as a consequence, also cracks in the salt body SK. There is only little or low adhesion between salt body SK and casting mould lining GFA and this low adhesion immediately leads, during cooling, to detachment of the casting mould lining from the salt body SK.

Figure 5:
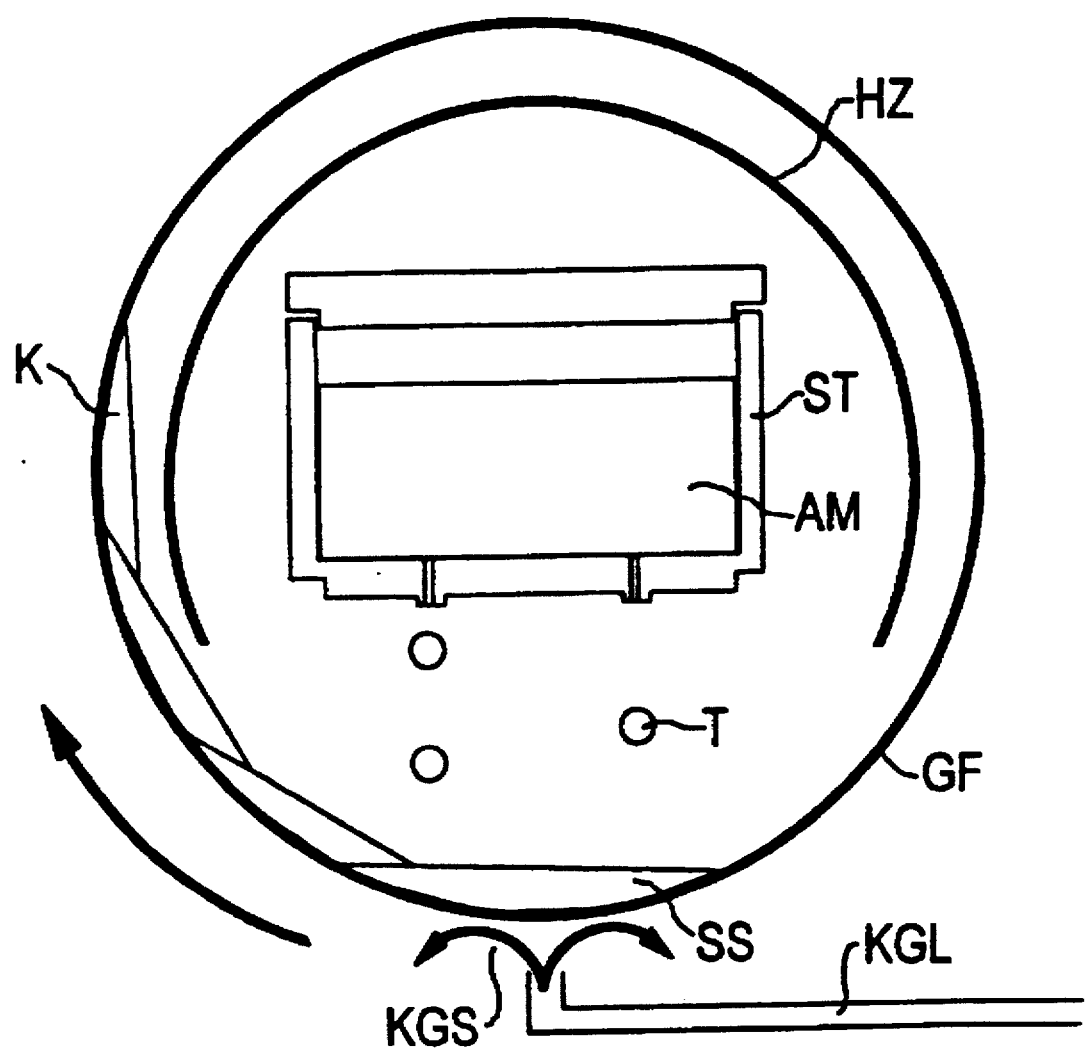
FIG. 5 is a diagrammatic cross-sectional view of a second device according to the invention which comprises a cylindrical casting mould.

FIG. 5 shows a device which can be used to produce highly curved salt plates. For this purpose the casting mould GF is designed as a hollow cylinder which is rotatably mounted and is depicted in the figure in the cross-section perpendicular to the long axis of the cylinder. The casting mould GF in turn consists of a material which is inert towards the salt melt or has a surface lining of such a material. In the upper region of the cylindrical casting mould GF in which the inner wall is extending virtually perpendicular or is even overhanging, the resulting salt bodies K are prevented from falling down by another hollow cylinder HZ which is open at the bottom. This inner hollow cylinder HZ has a diameter such that just sufficient space for the silt bodies K remains between the outer wall of the inner hollow cylinder HZ and inner wall of the cylindrical casting mould GF. The melting crucible ST for the salt melt SS is located inside the cylindrical casting mould GF. Melt emerges through fine outlet openings A in the base of the melting crucible ST.

The process can be carried out in sections, in which case the salt melt which has flowed in is in each case allowed substantially to solidify before the casting mould is rotated around the long axis by a certain angle. This entails formation in each case of salt bodies K in the form of segments of a circle which are allowed to grow together with the next segment in each case.

It is also possible to allow the salt melt SS to flow in continuously and slowly. During the addition of the salt melt, the cylindrical casting mould GF rotates slowly around its long axis. The speed of rotation is in this case set to be low enough for the level of the salt melt in the cylindrical casting mould not to become too high.

A salt body in the form of a hollow cylinder produced in this way can be employed in particular as a scintillator for whole-body films in radiography. For this purpose, the cylinder preferably has dimensions such that it is suitable for filming a whole human body or a part (head). For example, this process .can be used to produce a salt cylinder with a diameter of 60 cm and a length of 2 m.

After solidification is complete, the salt cylinder is also slowly cooled to room temperature and removed from the mould. Once again, removal from the mould is facilitated if the casting mould is composed of a plurality of segments of a cylinder.

In an advantageous embodiment of the invention, which is not depicted, the cylindrical casting mould GF can also be designed as completely closed device which is suitable for filling with inert gas. It is thus possible, in particular, to process hygroscopic salts or produce correspondingly hygroscopic salt plates. A completely closed device may, in particular, be supplemented by flushing gas lines which lead to the outside and through which a continuous stream of inert gas (for example dry nitrogen) can be blown through the device in order to prevent penetration in of unwanted moisture or reaction of the salt with atmospheric constituents, for example oxidation of the doping substance.

Figure 6:
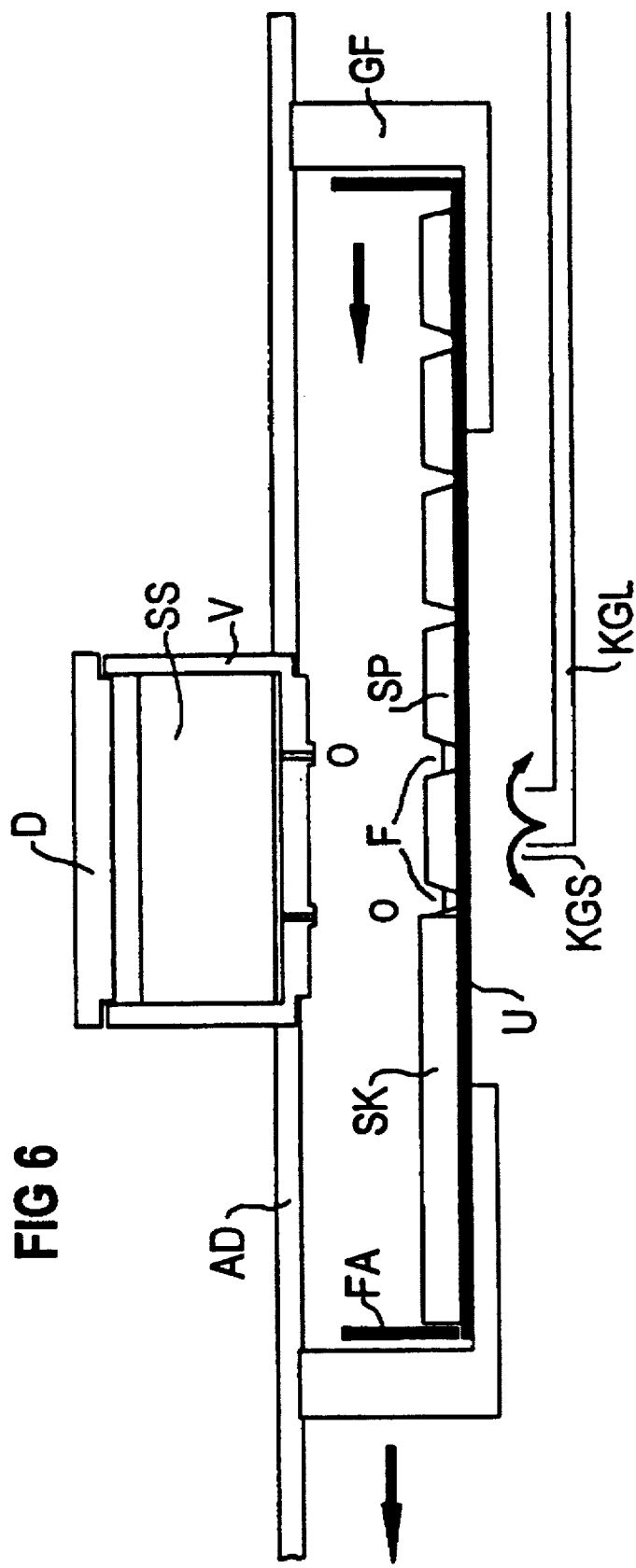
FIG. 6 is a diagrammatic cross-sectional view of a device during another embodiment.

FIG. 6 shows a simple device which has already been described in principle and which is suitable for carrying out the third process version according to the invention. Once again the device essentially consists of three parts, namely the casting mould GF, the melting crucible V for the salt melt SS and a lid D for the melting crucible V. The three parts are designed so that they can be stacked interlockingly one on top of the other and together form a gas-tight device.

The casting mould GF is provided on the side walls and on the base with a mould lining FA which is inert towards the salt melt SS. The mould lining can consist of a plurality of parts, for example of the base U and the side parts. Crystalline salt plates SP are arranged side by side on the base U in such a way that narrow gaps F remain between the salt plates SP. The salt plates can have any desired size and are produced by a suitable conventional crystal-growing process. For example, single crystals are produced by the Stockbarger process and divided up by sawing into the appropriate salt plates. The thickness of the salt plates in this case corresponds to the required thickness of the salt body to be produced.

The thickness of the salt body (crude plate) produced by the process will preferably, because of the formation of shrinkage cavities in the final stage of crystallization, be up to 30% greater than the desired thickness of the finished workpiece. However, the salt plates are in any case thick enough to provide sufficient mechanical strength for safe handling, and so that the salt plates are not completely melted by contact with the salt melt to be poured over later. The sloping side edges of the salt plates SP are also clearly evident. The gaps F between the salt plates SP thus have a trapezoidal cross-section and have their smallest width at the base U.

The salt melt SS is produced from a starting material which has a composition appropriate for the application. The composition of the salt melt SS must correspond to the composition of the salt bodies SK if the gaps F between the salt plates SP are no longer to be visually apparent after crystallization of the melt. By using a melt SS whose composition differs from the salt plates SP it is possible to produce salt bodies SK which have a structure with respect of their optical properties. The other process conditions are set similar to those in the first exemplary embodiment (FIGS. 1–4). The salt melt SS can be produced directly in the melting crucible V by introducing solid starting material into the melting crucible V and heating the device to a temperature above the melting point of the salt, for example by placing the device in an oven. However, it is also possible for the salt melt to be produced in an external melting crucible (not depicted) and subsequently to be introduced into the melting crucible which is then designed as supply vessel V.

The base of the melting crucible V has narrow outlet openings A through which the melt can flow in a fine stream into the casting mould GF in order initially to fill in the gaps F there. Another possibility is for the salt melt to be produced in an external device and introduced, by means of a suitable heated supply line, directly into the casting mould and poured over the salt plates.

The melting crucible V in the depicted embodiment has a smaller base than the casting mould GF. The arrangement of the salt plates SP and preparation of the melt SS are carried out as in the device described by means of FIG. 1, but with the difference that a relative movement between the casting mould GF and the melting crucible V can be carried out, and that the pouring of the salt melt SS over the salt plates SP starts initially at one end of the casting mould. As soon as the gaps F are filled in, a relative movement between melting crucible V and casting mould GF is carried out, indicated by the arrows depicted, in order to locate the melting crucible V and the outlet openings A above as yet unfilled gaps F.

Filling of all the gaps results in the required salt body SK which can be coated with melt up to a required thickness by repeating the process or by adding further salt melt during another relative movement.

The process of crystallization of the salt body SK is described in detail hereinafter by means of FIGS. 7 to 10 which depict a partial section through the casting mould with the salt bodies located therein during various stages of the process.

Figure 7:
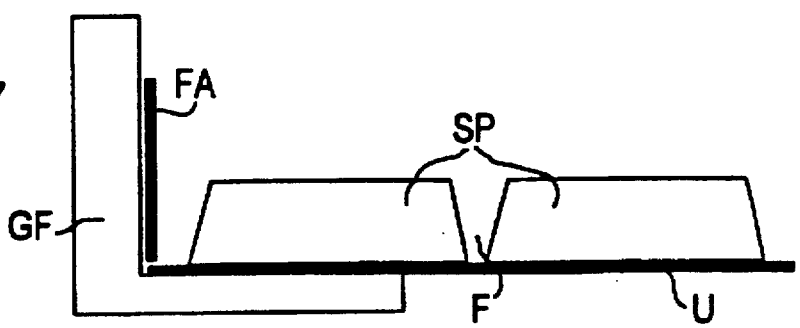
FIGS. 7–10 are diagrammatical partial cross-sectional views of the mould of the device of FIG. 6 with FIG. 7 showing the mould before melt has been added, FIG. 8 showing the mould with a partial addition of the melt.

FIG. 7 shows the arrangement of the salt plates SP in the casting mould GF.

Figure 8:
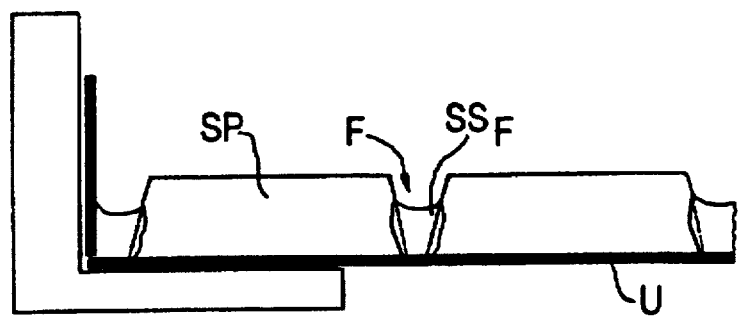

FIG. 8 shows the arrangement after the addition of the first portion of salt melt SS. The gaps F have already been partly filled with salt melt SS. Owing to the high temperature of the salt melt SS, which is originally 30° to 60° above its solidification point, there is initially partial melting of the salt plates in the gaps F. Since the base is kept by the cooling at a temperature which is 5° to 50° below the solidification point of the salt melt, the salt melt $SS_F$ which has flowed in starts to crystallize above the base of the casting mould and thus forms a solid salt crust. While a solid continuous salt body SK is formed in this way, further salt melt is poured over the salt plates SP until the level of the melt $SS_U$ above the salt plates is such that no shrinkage cavities can form in the gaps. In this case too, owing to the supernatant melt $SS_U$, there is superficial melting of the salt plates.

Figure 9:
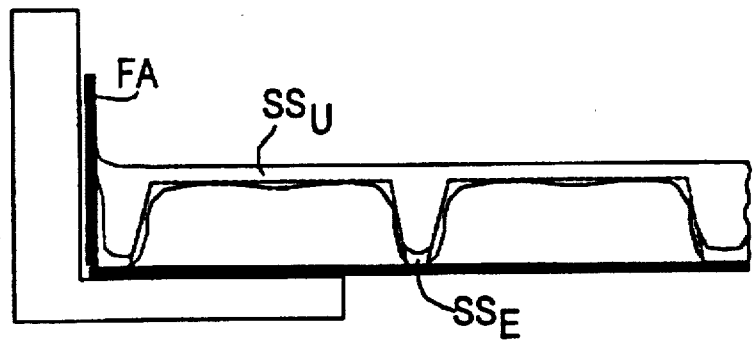

FIG. 9 shows the arrangement which has already been supplied with sufficient melt $SS_U$ for it to cover the salt plates SP entirely. The melt $SS_E$ which has already crystallized out or solidified in the gaps above the base prevents further contact of the melt with the casting mould and floating up of the salt plates. The wall regions of the mould lining FA are also at a temperature below the solidification point of the melt so that the melt also solidifies there on contact with the casting mould lining GFA.

Figure 10:
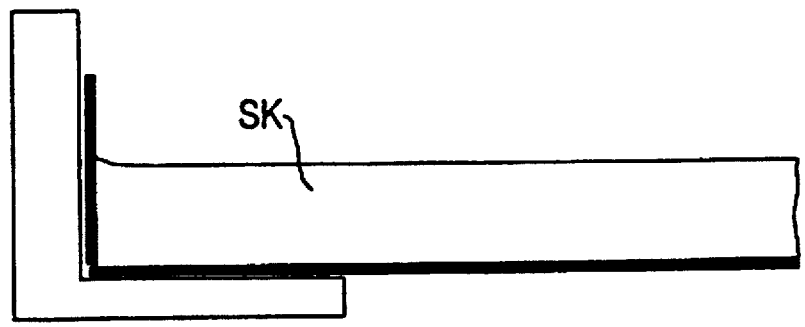

FIG. 10: Unchanged cooling of the casting mould results finally in complete solidification of the supernatant salt melt, with formation of a uniform salt body SK which has no distortions or other noticeable grain boundaries corresponding to the original salt plates SP. It is also clear and bubble-free.

The described process can be used to produce salt bodies SK with a base of any desired size and of any desired shape. The process additionally does not depend on the nature of the salt or the composition of the melt so that it is possible to produce salt bodies of any desired composition as long as they have a cubic crystal structure and crystallize uniformly out of the melt. However, the process is particularly suitable for producing large-area salt plates which cannot be produced with conventional processes. Such large-area plates of a luminescent material or of a salt, for example an alkali metal halide, doped with a suitable activator are required, for example, in the Anger camera. However, undoped large-area salt plates can also, because of their high radiation absorption and optical purity which can be achieved with the process, be employed as radiation protection windows. This makes visual observation of radiation sources, for example of radioactive material in "hot chambers", possible. By suitable design of the casting mould, the salt plates can be produced directly in the required shape and with the required cross-section.

FIG. 11 shows a modification of this version of the process in which the device described by means of FIG. 5 can be used. For this purpose, the casting mould GF is designed as hollow cylinder which is depicted in the figure in cross-section perpendicular to the centre line of the cylinder. The appropriately shaped salt plates SP are now arranged above the inner wall of the casting mould which is in the form of a hollow cylinder until the entire inner wall of the casting mould is covered thereby. In order to achieve good thermal contact between the salt plates SP and the mould, the surfaces of the salt plates SP must be curved corresponding to the shape of the cylinder, or the inside of the mould must be designed with flat surfaces. In the upper region of the cylindrical casting mould GF where the inner wall is extending virtually perpendicular or even has an overhang, the salt plates or bodies are prevented from falling down by the hollow cylinder HZ which is open at the bottom and already known from FIG. 5.

The melting crucible V can once again be located in the interior of the hollow cylinder. Melt SS emerges through fine outlet openings A in the base of the melting crucible V and fills the gaps F between the salt plates SP in the lower region of the casting mould GF. The supply of melt SS is now stopped until the melt between the gaps has solidified. The cylindrical casting mould GF is subsequently rotated around its centre line until the next unfilled gaps come to a stop below the outlet openings A. Then further melt is allowed to flow in and solidify. Finally, by further rotation of the casting mould and repeating the process, all the gaps F of the salt plates SP arranged on the inner wall of the cylindrical casting mould GF are filled and solidified. It is also possible to allow the salt melt SS to flow in continuously and slowly and, at the same time, cause the cylindrical casting mould GF likewise to rotate slowly so that the poured-in melt solidifies sufficiently quickly in the gaps until all the gaps are filled.

In an advantageous embodiment, which is not depicted, of the invention it is also possible for the cylindrical casting mould GF to be designed as completely closed device which is suitable for filling with inert gas.

I claim:

1. A process for the production of a polycrystalline salt body comprising the steps of:
    providing a furnace having a single chamber heated to a uniform temperature for melting a starting material with a composition intended for the salt body;
    providing a melting crucible which is inert to the salt melt,
    providing a casting mould with a base,
    producing a salt melt by inserting the crucible with the starting material and the casting mould into the chamber,
    introducing the salt melt into the casting mould and directly cooling only the base to keep the base at a temperature which is 1°–50° C. below a solidification point of the salt melt to form a solid salt crust directly on the base of the casting mould,
    maintaining the casting mould at a temperature below the solidification point until the supernatant salt melt has solidified completely into a polycrystalline salt body and then cooling the salt body.

2. Process according to claim 1, wherein the step of introducing the salt melt takes place continuously with the melting.

3. Process according to claim 1, wherein before the step of introducing of the salt melt, includes arranging at least two crystalline salt plates which are in block or plate form and have a composition corresponding to the salt bodies side by side on the base of the casting mould in such a way that gaps of small width remain between the plates, and the step of introducing the salt melt pours the melt over the salt plates until at least the gaps are filled with the salt melt.

4. Process according to claim 3, in which the base of the casting mould is kept at a temperature which is 5°–50° C. below the solidification point of the salt melt.

5. A process according to claim 1, wherein the salt body is a scintillator plate for the detection of gamma rays, in particular for the Anger camera.

6. Process according to claim 1, which includes providing a relative movement between the melting crucible and the casting mould during the introducing of the salt melt.

7. A process according to claim 1, wherein the salt body is a large-area inspection window which is suitable for shielding high-energy radiation.

8. Process according to claim 1, wherein the casting mould is a hollow cylinder with a longitudinal axis and the process includes rotating the hollow cylinder on said axis during the step of introducing the salt melt.

9. Process according to claim 1, which includes providing a protective gas atmosphere so that the melting, maintaining and cooling are carried out in the protective gas atmosphere.

10. Process according to claim 3, wherein the step of arranging uses salt plates with sloping edges so that a support area of the plates in the casting mould is larger than the surface area opposite thereto.

11. A process according to claim 1, wherein the base of the melting crucible has fine outlet openings for the salt melt, the crucible together with the casting mould form a closed device in which the crucible is connected to the mould by pressure equalization channels, wherein the step of introducing of the salt melt takes place continuously with the melting of the starting material through the outlet openings, and wherein the step of directly cooling the base includes directing a flow of cooling medium directly on an outer surface of the base.

12. Device for the production of large-area polycrystalline salt bodies comprising:

a furnace having a single chamber, a casting mould with an inert lining positioned in the chamber, a melting crucible, which is located above the casting mould and has a base region with fine outlet openings for the salt melt, the melting crucible forming together with the casting mould a closed system with pressure equalization channels, and means for directly cooling the base of the casting mould being placed in said chamber.

13. Device according to claim 12 wherein the means for directly cooling includes a cooling gas line with which a stream of cooling gas can be blown onto the base.

14. Device according to claim 12, in which the casting mould is designed as rotatable hollow cylinder and is located outside the melting crucible.

15. Device according to claim 12, in which the melting crucible and casting mould are lined with glassy carbon or a noble metal.

16. Device according to claim 12, which includes means for carrying out a horizontal relative movement between melting crucible and casting mould.

17. Device according to claim 12, in which the casting mould is designed as a rotatable hollow cylinder in which the melting crucible is located.

18. A process for the production of a polycrystalline salt body comprising the steps of:

providing a casting mould having a base with a shape of a hollow cylinder with a longitudinal axis, producing a salt melt by melting a starting material with a composition intended for the salt body in a melting crucible which is located inside the mould and is inert toward the salt melt, rotating the hollow cylinder on said axis, introducing the salt melt into the rotating casting mould while keeping at least the base at a temperature which is 1°–50° C. below a solidification point of the salt melt to form a solid crust directly on the base of the casting mould, maintaining the casting mould at a temperature below the solidification point until the supernatant salt melt has solidified completely into a polycrystalline salt body and then cooling the salt body.

* * * * *